(12) United States Patent
Ichinari et al.

(10) Patent No.: US 11,275,042 B2
(45) Date of Patent: Mar. 15, 2022

(54) ELECTRODE ASSEMBLY FOR CONDUCTIVITY METER OR RESISTIVITY METER, CONDUCTIVITY METER AND RESISTIVITY METER USING THE SAME ELECTRODE ASSEMBLY

(71) Applicant: HORIBA Advanced Techno, Co., Ltd., Kyoto (JP)

(72) Inventors: Yuichi Ichinari, Kyoto (JP); Riichiro Suzuki, Kyoto (JP); Yugo Nishitani, Kyoto (JP)

(73) Assignee: HORIBA Advanced Techno, Co., Ltd., Kyoto (JP)

( * ) Notice: Subject to any disclaimer, the term of this patent is extended or adjusted under 35 U.S.C. 154(b) by 204 days.

(21) Appl. No.: 16/203,473

(22) Filed: Nov. 28, 2018

(65) Prior Publication Data

US 2019/0187084 A1  Jun. 20, 2019

(30) Foreign Application Priority Data

Dec. 15, 2017  (JP) .............................. JP2017-241192

(51) Int. Cl.
   *G01N 27/07*  (2006.01)
   *G01R 27/22*  (2006.01)
   (Continued)

(52) U.S. Cl.
   CPC .............. *G01N 27/07* (2013.01); *G01N 27/06* (2013.01); *G01N 27/08* (2013.01); *G01R 27/22* (2013.01); *G01N 27/308* (2013.01)

(58) Field of Classification Search
   CPC ........ G01N 27/06; G01N 27/07; G01N 27/08; G01N 27/22; G01N 27/308; G01N 27/226; G01R 27/22
   (Continued)

(56) References Cited

U.S. PATENT DOCUMENTS 2,505,936 A * 5/1950 Behn ...................... G01N 27/07
                                                          324/441
2,616,949 A * 11/1952 Cade ...................... G01N 27/07
                                                          324/441
(Continued)

FOREIGN PATENT DOCUMENTS

EP       2381249 A2    10/2011
EP       3084409 A1    10/2016
(Continued)

OTHER PUBLICATIONS

European Patent Office, Extended European Search Report Issued in Application No. 18209420.1, dated Mar. 11, 2019, Germany, 12 pages.
(Continued)

*Primary Examiner* — Steven L Yeninas
(74) *Attorney, Agent, or Firm* — Alleman Hall Creasman & Tuttle LLP (57) ABSTRACT

An electrode assembly for a conductivity meter or resistivity meter includes: an electrode main body; a test liquid intake flow path passing through the electrode main body; a pair of voltage electrodes which is respectively provided so that surfaces thereof are exposed to opposing inner wall surfaces forming the test liquid intake flow path; and a pair of current electrodes which is respectively provided so that surfaces thereof are exposed to each of the inner wall surfaces, and in this configuration, each of the pair of current electrodes contains a carbon-based material, and each of the surfaces of the pair of current electrodes exposed to the inner wall surfaces is in a strip shape.

7 Claims, 7 Drawing Sheets

(51) Int. Cl.
  *G01N 27/08* (2006.01)
  *G01N 27/06* (2006.01)
  *G01N 27/30* (2006.01)

(58) Field of Classification Search
  USPC .................................................. 324/448, 446
  See application file for complete search history.

(56) References Cited

U.S. PATENT DOCUMENTS

| | | | | |
|---|---|---|---|---|
| 4,063,153 | A * | 12/1977 | Dechene | G01N 27/226 324/434 |
| 4,883,566 | A * | 11/1989 | Muccitelli | G01N 27/07 324/450 |
| 5,466,366 | A * | 11/1995 | Chia-ching | B01D 61/12 204/409 |
| 5,543,717 | A * | 8/1996 | Kordas | G01N 27/06 324/439 |
| 2002/0135377 | A1 * | 9/2002 | Farruggia | G01N 33/18 324/441 |
| 2002/0167322 | A1 * | 11/2002 | He | G01R 27/22 324/441 |
| 2008/0023328 | A1 * | 1/2008 | Jiang | E21B 47/10 204/407 |
| 2010/0321046 | A1 * | 12/2010 | Randall | G01N 27/07 324/696 |
| 2011/0252865 | A1 * | 10/2011 | Tokuda | G01N 15/0656 73/23.31 |
| 2011/0260738 | A1 * | 10/2011 | Selman | G01N 33/48735 324/649 |
| 2011/0309848 | A1 * | 12/2011 | Eberheim | C22C 32/0031 324/724 |
| 2013/0021047 | A1 | 1/2013 | Thieme et al. | |
| 2013/0027042 | A1 * | 1/2013 | Meignant | G01N 27/06 324/324 |
| 2015/0346373 | A1 * | 12/2015 | Jung | G01V 3/088 324/701 |
| 2015/0355122 | A1 * | 12/2015 | Watts | G01N 33/26 324/698 |
| 2017/0328880 | A1 * | 11/2017 | Todd | G01N 27/226 |
| 2018/0100825 | A1 * | 4/2018 | Santangelo | G01N 27/22 |
| 2018/0202929 | A1 * | 7/2018 | Scott | G01N 33/18 |
| 2018/0340906 | A1 * | 11/2018 | Lorincz | G01N 27/08 |

FOREIGN PATENT DOCUMENTS

| | | |
|---|---|---|
| JP | H11281604 A | 10/1999 |
| JP | 2000162168 A | 6/2000 |
| JP | 3334234 B2 | 10/2002 |
| JP | 2007212324 A | 8/2007 |
| WO | 2015049344 A1 | 4/2015 |
| WO | 2015091976 A1 | 6/2015 |

OTHER PUBLICATIONS

TetraCon 325 / TetraCon 325/C, Operating Manual, WTW GmbH, Jan. 2, 2005, Weilheim, Germany, http://www.globalw.com/downloads/WQ/TetraCon_325.pdf, 8 pages.

Japan Patent Office, Office Action Issued in Application No. 2017-241192, dated Nov. 18, 2021, 7 pages.

* cited by examiner

ELECTRODE ASSEMBLY FOR CONDUCTIVITY METER OR RESISTIVITY METER, CONDUCTIVITY METER AND RESISTIVITY METER USING THE SAME ELECTRODE ASSEMBLY

CROSS-REFERENCE TO RELATED APPLICATIONS

This application claims priority on Japanese Patent Application No. 2017-241192 filed on Dec. 15, 2017, the disclosure of which is incorporated by reference herein.

FIELD

The present disclosure relates to an electrode assembly for an AC four-electrode typed conductivity meter or resistivity meter and to a conductivity meter and a resistivity meter using the same electrode assembly.

BACKGROUND ART

Conventionally, as an electrode assembly for an AC four-electrode typed conductivity meter or resistivity meter, there has been known a configuration, as disclosed, for example, in Patent Literature 1, that a pair of current electrodes (voltage application electrodes) and a pair of voltage electrodes (voltage detection electrodes) are arranged side by side on a plane inside a test liquid intake flow path. In such an electrode assembly for a conductivity meter or resistivity meter, there is a lot of electric flux lines leaking out to an outside of the electrode assembly through an inlet and an outlet of a test liquid. Therefore, in some usage conditions, a density of the electric flux lines may significantly vary between the pair of voltage electrodes. As a result, measurement values of the conductivity or resistivity may significantly vary, and, therefore, there may be a problem that an accurate measurement cannot be performed.

Recently, there has been increasing not only a demand for an electrode assembly for a conductivity meter or resistivity meter capable of reducing such leakage of electric flux lines to an outside of a test liquid intake flow path, but also a demand for an electrode assembly for a conductivity meter or resistivity meter that is easy to manufacture and excellent in processability.

CITATION LIST

Patent Literature

Patent Literature 1: JP H11-281604A

SUMMARY

Technical Problem

Therefore, it is an object of the present disclosure to provide an electrode assembly for an AC four-electrode typed conductivity meter or resistivity meter that is capable of reducing leakage of electric flux lines to an outside of a test liquid intake flow path and easy to manufacture and excellent in processability.

Solution

That is, an electrode assembly for a conductivity meter or resistivity meter according to an embodiment of the present invention includes: an electrode main body; a test liquid intake flow path passing through the electrode main body; a pair of voltage electrodes which is respectively provided so that surfaces thereof are exposed to opposing inner wall surfaces forming the test liquid intake flow path; and a pair of current electrodes which is respectively provided so that surfaces thereof are exposed to each of the inner wall surfaces, and in this configuration, each of the pair of current electrodes contains a carbon-based material, and each of the surfaces of the pair of current electrodes exposed to the inner wall surfaces is in a strip shape.

With this configuration, since the pair of current electrodes is provided so as to be opposed to each other across the test liquid intake flow path interposed therebetween, the electric flux lines generated from one of the current electrodes are easier to directly enter the other current electrode without going around the electrode main body. Therefore, it is possible to suppress the electric flux lines from leaking to the outside of the electrode main body. Therefore, even in the case where the electrode assembly of the embodiment of the present invention is brought close to a wall or the like of a beaker containing a test liquid, for example, during a measurement, a density of the electric flux lines formed between the pair of voltage electrodes is not significantly varied and a measurement value of conductivity or resistivity is not significantly varied. That is, it is possible to perform a measurement of conductivity or resistivity with high accuracy regardless of a measurement location.

Further, with this configuration, it is possible to provide an electrode assembly for an AC four-electrode typed conductivity meter or resistivity meter that is easy to manufacture and excellent in processability. For example, since each of end faces of each of the current electrodes is in a strip shape without surrounding the voltage electrodes, in the case where, in a manufacturing process, the voltage electrodes and the current electrodes are placed in a tubular mold and a resin such as a thermosetting resin is poured into the mold, the resin is allowed to easily flow into a space between the voltage electrodes and the current electrodes, and the resin can be easily filled in the mold during this process. Whereas, in the case where a shape of a current electrode is made to be, for example, an annular shape so as to surround a voltage electrode, since the annular shaped current electrode surround the voltage electrode, there may arise a problem that the resin is not easily filled between the voltage electrode and the current electrode in a manufacturing process. In contrast, by making each of the end faces of each of the current electrodes to being in a strip shape as mentioned above, such a problem can be solved.

Furthermore, since each of the end faces of each of the current electrodes is in a strip shape, it is only necessary to cut off, for example, a plate-shaped current electrode prepared in advance at a time of manufacturing and it is easy to process the current electrodes per se. Therefore, it is possible to easily vary the area and the like of each of the current electrodes according to a specification of a product.

Note that the term "a strip shape" referred here in the present description means a belt-like shape with both ends thereof not being connected, in other words, a finite belt-like shape, and it does not include a shape having an outer periphery and an inner periphery such as an annular shape.

Moreover, since each of the current electrodes contains a carbon-based material, it is possible to exhibit excellent chemical resistance and alkali resistance. Note that the term "containing a carbon-based material" mentioned here means that each of the current electrodes is made of only a carbon-based material or made of a composite material of a carbon-based material and a material other than a carbon-based material.

Note that, regarding the current electrode containing the carbon-based material, since it is necessary to carry out a firing process at a time of manufacturing, it is generally difficult to process the current electrode as compared to that made of a metal material. However, as described above, in the electrode assembly for the conductivity meter or the resistivity meter of the embodiment of the present invention, each of the end faces of the current electrode is in a strip shape and it is easy to process the current electrode per se, and therefore it is possible to adapt one containing a carbon-based material as the current electrode.

Note that the term "conductivity" referred here in the present description means "electrical conductivity" defined by JIS (Japanese Industrial Standards) and the term "resistivity" means "electrical resistivity" defined by JIS.

Preferably, the above-mentioned electrode assembly for the conductivity meter or the resistivity meter is configured such that, plural pairs of current electrodes are provided and the pair of voltage electrodes is positioned between the plural pairs of current electrodes.

With this configuration, the pair of voltage electrodes is interposed so as to be sandwiched between the plural pairs of current electrodes, and it is possible to increase the density of the electric flux lines passing through between the pair of voltage electrodes and the leakage of the electric flux lines to the outside of the electrode main body can be further reduced. Therefore, it is possible to further reduce fluctuations in conductivity and resistivity during the measurement.

Further, it is preferable that, the electrode main body is formed to have a column shape such as a cylindrical columnar shape, the test liquid intake flow path is formed so as to pass through a side peripheral surface of the electrode main body, the pair of voltage electrodes and the pair of current electrodes are provided so as to be parallel to an axis direction of the electrode main body, and the pair of voltage electrodes and the pair of current electrodes are provided so as to be adjacent to each other along a passing-through direction of the test liquid intake flow path.

With this configuration, when resin is poured into a tubular mold to fix the current electrodes and the voltage electrodes in the manufacturing process, the resin can be more easily poured between the current electrodes and the voltage electrodes. Further, it is possible to allow air bubbles between the current electrodes and the voltage electrodes to escape more easily.

As a specific aspect of the carbon-based material, there can be listed a glassy carbon material.

With such a material, mechanical strength of the current electrode per se can be improved. In addition, as described above, since each of the end faces of the current electrode of the embodiment of the present invention is in a strip shape, the current electrode can be processed more easily as compared to that having an annular end face. Therefore, a hard material such as a glassy carbon material can be adapted.

Also, an electrode assembly for a conductivity meter or resistivity meter according to an embodiment of the present invention includes: an electrode main body; a test liquid intake flow path passing through the electrode main body; a pair of voltage electrodes which is respectively provided so that surfaces thereof are exposed to opposing inner wall surfaces forming the test liquid intake flow path; and a pair of current electrodes which is respectively provided so that surfaces thereof are exposed to each of the inner wall surfaces, and in this configuration, each of the pair of current electrodes contains a carbon-based material, and each of the current electrodes and each of the voltage electrodes are respectively surrounded by a resin member in each of the inner wall surfaces, and the resin member surrounding the current electrodes and the resin member surrounding the voltage electrodes may be continuous.

With this arrangement, there can exert an action and effect similar to that obtained by the above-mentioned electrode assembly for the conductivity meter and the resistivity meter in which each of the surfaces of the pair of current electrodes exposed to the inner wall surface has a surface shape of a strip shape.

Note here that the expression "the resin member surrounding the current electrodes and the resin member surrounding the voltage electrodes being continuous" means that the resin member surrounding the current electrodes and the resin member surrounding the voltage electrodes are continuously connected without interruption. In other words, it means that, at the time of pouring the resin such as a thermosetting resin into the mold while the current electrodes and the voltage electrodes are placed in the mold in the manufacturing process, the resin is allowed to flow into a space between the voltage electrodes and the current electrodes and the resin is filled in this period.

Further, the conductivity meter according to an embodiment of the present invention includes: the above-mentioned electrode assembly for the conductivity meter or the resistivity meter; and a conductivity calculator that receives an output signal of the electrode assembly and calculates the conductivity based on the received output signal and outputs the calculated conductivity.

Further, the resistivity meter according to an embodiment of the present invention includes: the above-mentioned electrode assembly for the conductivity meter or the resistivity meter; and a resistivity calculator that receives an output signal of the electrode assembly and calculates the resistivity based on the received output signal and outputs the calculated resistivity.

With this conductivity meter and the resistivity meter, there can exert an action and effect similar to that obtained by the electrode assembly for the conductivity meter and the resistivity meter described above.

Advantageous Effects

According to embodiments of the present invention configured as described above, it is possible to provide the electrode assembly for the AC four-electrode typed conductivity meter or resistivity meter that is capable of reducing leakage of electric flux lines to an outside of a test liquid intake flow path and easy to manufacture and excellent in processability.

DETAIL DESCRIPTION

A preferred embodiment of the present invention will be described below with reference to the accompanying drawings. It should be noted that a conductivity meter to be described below is one for embodying a technical idea of the present invention and the present invention is not limited to the following unless otherwise specified. In addition, contents described in one embodiment can be applied to other embodiments. Further, sizes and positional relationships and the like of members shown in each of the drawings may be exaggerated in order to clarify the explanation.

A conductivity meter 100 according to the present embodiment is AC four-electrode typed one for measuring conductivity of a test liquid such as a material liquid or a cleaning liquid for use in a semiconductor process.

Figure 1:
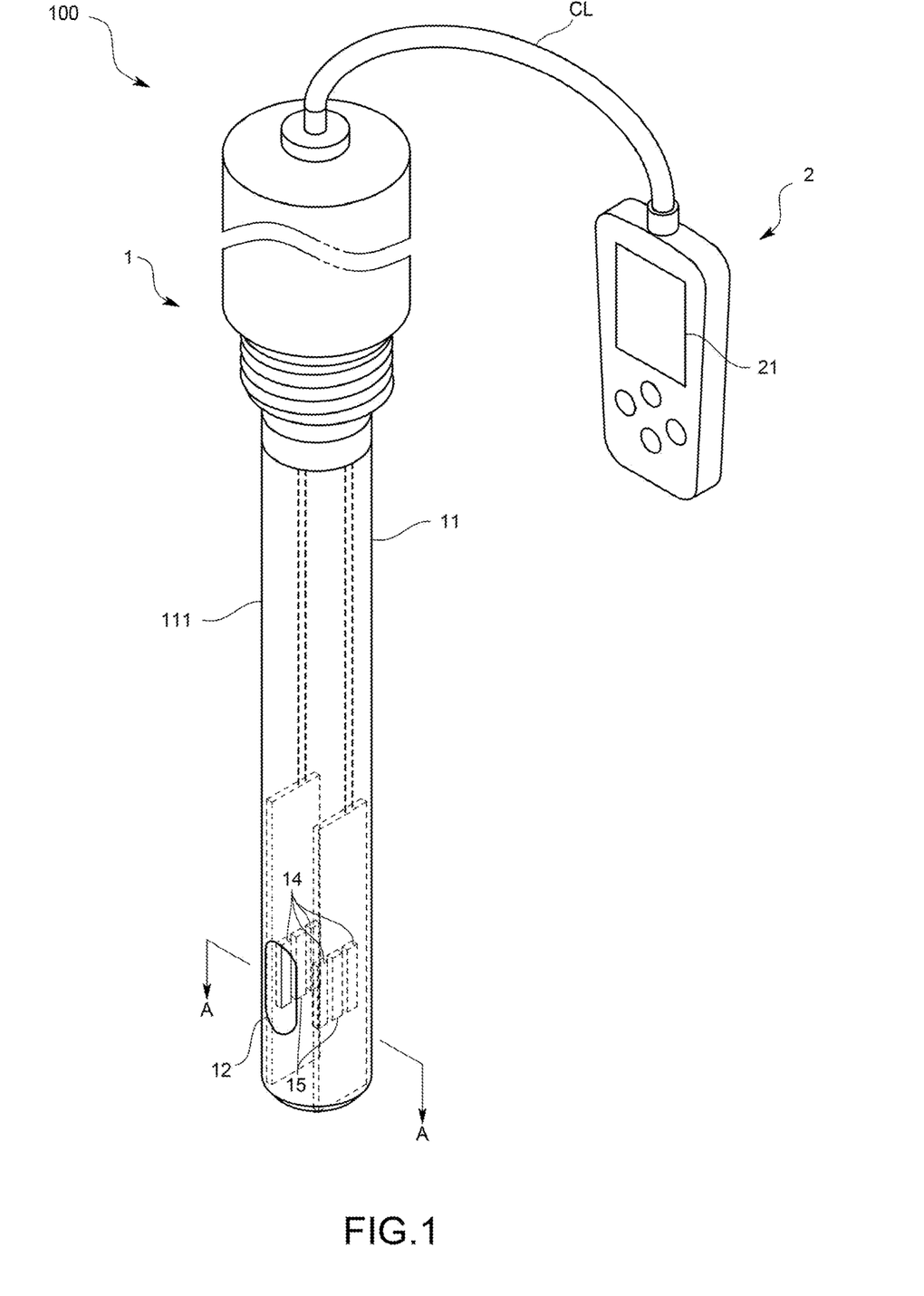
FIG. 1 is a schematic diagram showing a configuration of a conductivity meter of the present embodiment.

Specifically, as shown in FIG. 1, this conductivity meter 100 includes: an electrode assembly 1 (also, referred to as "conductivity electrode") to be immersed in a test liquid; and a conductivity meter main body 2 (corresponding to "conductivity calculator" of the present invention) which is electrically connected to the electrode assembly 1 via a cable CL. Each part will be described below.

As shown in FIG. 1, the electrode assembly 1 includes: a body 11 (corresponding to "electrode main body" of the present invention); a test liquid intake flow path 12 formed passing through the body 11; plural current electrodes 14 provided so as to sandwich the test liquid intake flow path 12; and plural voltage electrodes 15 provided so as to sandwich the test liquid intake flow path 12 similarly to the current electrodes 14.

The body 11 is configured to accommodate and hold the plural current electrodes 14 and the plural voltage electrodes 15. This body 11 has an elongated cylindrical columnar shape and it is made of a material having high insulation property. In this embodiment, it is made of a thermosetting resin material such as an epoxy resin material.

Figure 3:
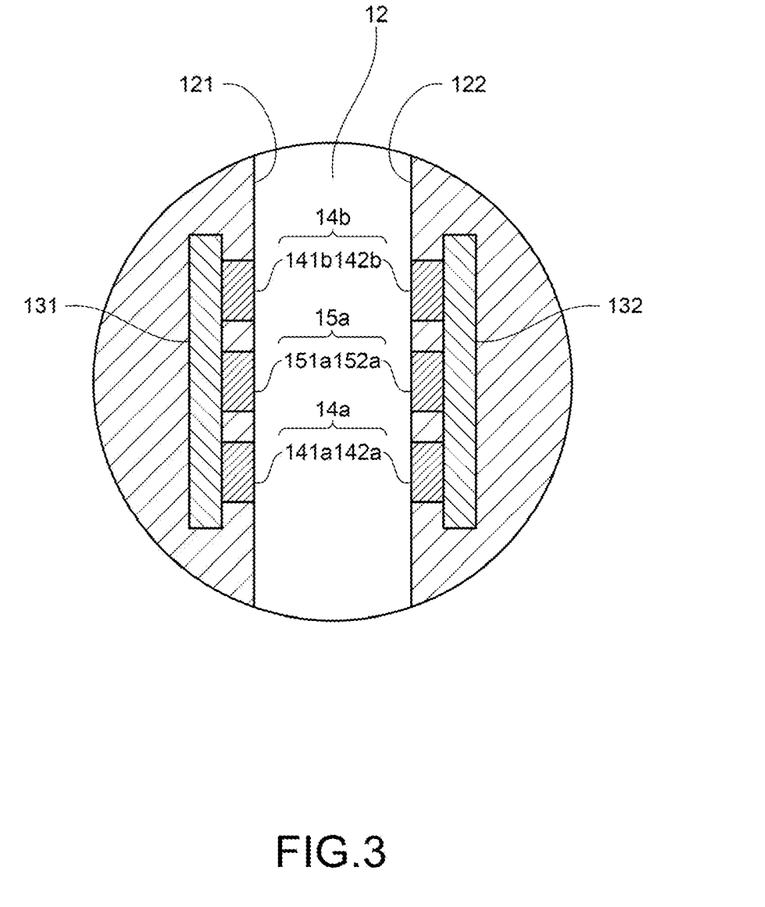
FIG. 3 is a cross-sectional view taken along a line A-A in FIG. 1.

The test liquid intake flow path 12 is provided for taking in the test liquid for measuring conductivity into the body 11. This test liquid intake flow path 12 is formed so as to pass through a side peripheral surface 111 of the body 11 in a direction perpendicular to an axial direction of the body 11 in a vicinity of a distal end portion of the body 11, and a sectional shape thereof is an elongated hole shape in a cross section parallel to the axial direction of the body 11. As shown in FIG. 3, this test liquid intake flow path 12 is formed of two inner wall surfaces 121 and 122 opposing to each other which are parallel to the axial direction of the body 11.

It should be noted here that the expression "passing through a side peripheral surface of the body" means that the test liquid intake flow path 12 is formed so that the test liquid is allowed to be in fluid communication in the direction perpendicular to the axial direction of the body 11.

Figure 2:
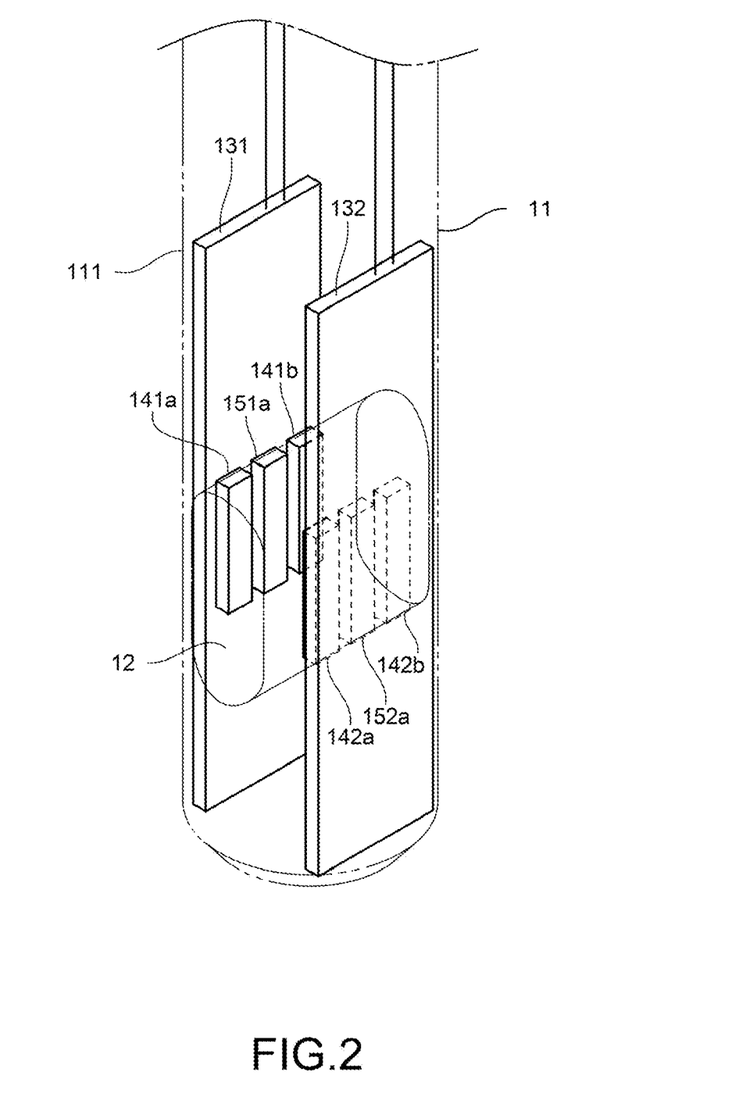
FIG. 2 is a schematic diagram showing a configuration of a current electrode and a voltage electrode of an electrode assembly of the same embodiment.

As shown in FIGS. 2 and 3, two rectangular plate shaped electronic substrates 131 and 132 are accommodated in the body 11 in a manner of interposing the test liquid intake flow path 12 therebetween, and the plural current electrodes 14 and the plural voltage electrodes 15 are attached to these substrates 131 and 132. Lead wires electrically connecting to the plural current electrodes 14 and the plural voltage electrodes 15 are connected to end faces of the electronic substrates 131 and 132, and these lead wires extend from a proximal end of the electrode assembly 1 as the cable CL which is connected to the conductivity meter main body 2.

The plural current electrodes 14 are provided for causing an electric field in the test liquid intake flow path 12 and causing current to flow into the test liquid accommodated in the test liquid intake flow path 12. Specifically, the plural current electrodes 14 are respectively rectangular plate shaped made of plastic-formed carbon, which are provided on the body 11 so that the surfaces of the strip shape are exposed to the inner wall surfaces 121 and 122 mentioned above. As shown in FIG. 2, each of the current electrodes 14 is provided so that a longitudinal direction thereof is parallel to the axial direction of the body 11.

As shown in FIGS. 2 and 3, these plural current electrodes 14 include a pair of current electrodes 14a (referred to as "first paired current electrodes" hereinafter) and another pair of current electrodes 14b (referred to as "second paired current electrodes" hereinafter), and the first and second paired current electrodes 14a and 14b are respectively provided in a manner of opposing to each other while interposing the test liquid intake flow path 12 therebetween. The first and second paired current electrodes 14a and 14b are respectively provided in parallel along the passing-through direction of the test liquid intake flow path 12.

The plural voltage electrodes 15 are provided for detecting a potential difference caused in the test liquid accommodated in the test liquid intake flow path 12. Specifically, the plural voltage electrodes 15 are respectively rectangular plate shaped made of plastic-formed carbon, which are provided on the body 11 so that the surfaces of the strip shape are exposed to the inner wall surfaces 121 and 122 mentioned above, similarly to the current electrodes 14. Each of the voltage electrodes 15 is provided so that a longitudinal direction thereof is parallel to the axial direction of the body 11.

These plural voltage electrodes 15 include a pair of voltage electrodes 15a (referred to as "paired voltage electrodes" hereinafter), and the pair of voltage electrodes 15a is provided in a manner of opposing to each other while interposing the test liquid intake flow path 12 therebetween.

As shown in FIGS. 2 and 3, the electrode assembly 1 of the present embodiment is configured so that the paired voltage electrodes 15a are positioned between the first paired current electrodes 14a and the second paired current electrodes 14b. Specifically, the first paired current electrodes 14a, the paired voltage electrodes 15a, and the second paired current electrodes 14b are provided in this order with an insulating resin (a part of the body 11) interposed between any adjacent two of these electrodes at equal intervals so as to be adjacent to one another along the passing-through direction of the test liquid intake flow path 12.

More specifically, on one side of the inner wall surface 121 forming the test liquid intake flow path 12, there is interposed a voltage electrode 151a which is one of the paired voltage electrodes 15a between a first current electrode 141a which is one of the first paired current electrodes 14a and a second current electrode 141b which is one of the second paired current electrodes 14b, via the insulating resin.

More specifically, the first current electrode 141a, the second current electrode 141b, and the voltage electrode 151a are respectively surrounded by the insulating resin, and the insulating resin surrounding the first current electrode 141a, the second current electrode 141b, and the voltage electrode 151a are arranged so as to be continuous (that is, so as to be continuously connected or in communication with each other).

In addition, the first current electrode 141a which is one of the first paired current electrodes 14a and the second current electrode 141b which is one of the second paired current electrodes 14b are electrically connected via an electronic substrate 131.

On the other side of the inner wall surface 122 forming the test liquid intake flow path 12, there are provided a first current electrode 142a which is the other of the first paired current electrodes 14a, a second current electrode 142b which is the other of the second paired current electrodes 14b, and a voltage electrode 152a which is the other of the paired voltage electrodes 15a so as to have a similar configuration to the first current electrode 141a, the second current electrode 141b, and the voltage electrode 151a.

As shown in FIG. 3, the first current electrode 141a, the second current electrode 141b, and the voltage electrode 151a, which are provided on a side of the electronic substrate 131, are respectively provided in the body 11 such that the surfaces thereof are respectively exposed onto the same surface as the inner wall surface 121 (i.e., so as to be coplanar with the inner wall surface 121).

Similarly, the first current electrode 142a, the second current electrode 142b, and the voltage electrode 152a, which are provided on a side of the electronic substrate 132, are respectively provided in the body 11 such that the surfaces thereof are respectively exposed onto the same surface as the inner wall surface 122 (i.e., so as to be coplanar with the inner wall surface 122).

The conductivity meter main body 2 is adapted to receive an output signal of the electrode assembly 1 and calculate the conductivity of the test liquid based on the received output signal, and then the calculated conductivity is displayed on a display 21.

Specifically, the conductivity meter main body 2 integrally includes: a CPU; an A/D converter; a storage device; an input device; the display 21; and further a measurement circuit and the like including an AC power supply, an operational amplifier, and the like, as a hardware configuration. In this configuration, the CPU and peripheral equipment thereof, if necessary, are operated based on a program stored in the storage device, so that the conductivity of the test liquid can be calculated based on a current value flowing in the first paired current electrodes 14a and the second paired current electrodes 14b and a potential difference generated between the paired voltage electrodes 15a, for example, in a state of the electrode assembly 1 being immersed in the test liquid.

Specifically, in this configuration, the first paired electrodes 14a and the second paired electrodes 14b cause the current to flow into the test liquid and the potential difference in the test liquid is measured by the paired voltage electrodes 15a. Thus, the conductivity of the test liquid is calculated using ratio of the current value to the value of the potential difference (current value/voltage value). In addition, since the conductivity of the test liquid is varied according to temperature, the conductivity meter main body 2 is configured to be capable of temperature compensation so as to calculate an estimated value of conductivity at a temperature of 25° C. Specifically, a thermistor (not shown) is provided on the inner wall surface 121, and the conductivity meter main body 2 is configured so that the conductivity can be temperature-compensated based on temperature information obtained from the thermistor.

Next, a method of manufacturing the electrode assembly 1 of the present embodiment will be described. Note that, in order to simplify the explanation, a description of a step of connecting the lead wire and the like is omitted.

Figure 4A:
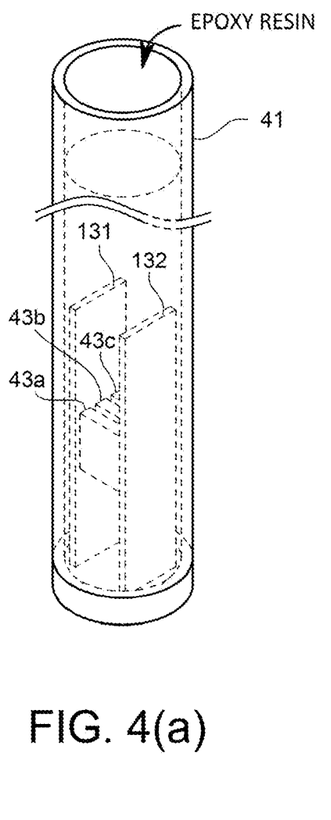
FIGS. 4(a) and 4(b) are schematic diagrams showing a manufacturing process of the electrode assembly of the same embodiment.

In the manufacturing method of the electrode assembly 1 of the present embodiment, as shown in FIG. 4(a), a bottomed tubular mold 41 for filling resin, two plate-shaped electronic substrates 131 and 132, three thick plate-shaped plastic-formed carbon plates 43a, 43b, and 43c are prepared. These thick plate-shaped plastic-formed carbon plates 43a and 43c are prepared to be formed as the current electrodes 14 after being processed and have shaped such that the plate-shaped current electrodes 14 are extended in a thickness direction. Likewise, the thick plate-shaped plastic-formed carbon plate 43b is prepared to be formed as the voltage electrodes 15 after being processed. These three thick plate-shaped plastic-formed carbon plates 43a to 43c are interposed and fixed between the two plate-shaped electronic substrates 131 and 132 so as to be arranged in parallel at regular intervals. Then, the resultant assembly is set in the tubular mold 41 in such a posture that the three thick plate-shaped plastic-formed carbon plates 43a to 43c stand side by side, and then the thermosetting resin such as epoxy resin is poured into the mold 41 from an open end as shown in FIG. 4(a). Thereafter, the epoxy resin is cured by heating or the like to thereby form the body 11 for accommodating and holding the electronic substrates 131 and 132 and the plastic-formed carbon plates 43a, 43b, and 43c inside thereof.

Figure 4B:
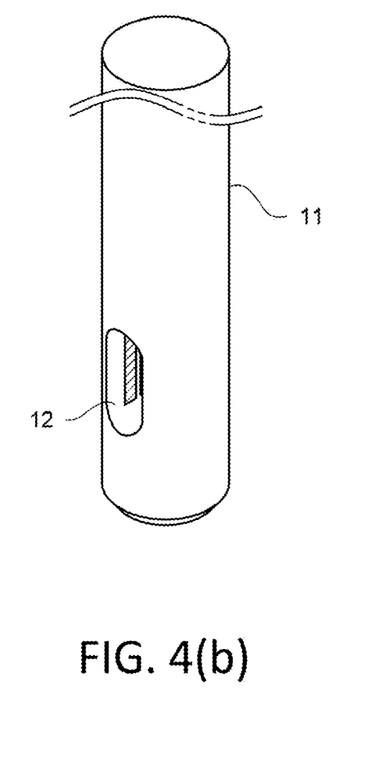

After taking out the body 11 from the tubular mold 41, as shown in FIG. 4(b), the body 11 is cut to form the test liquid intake flow path 12 passing through the side peripheral surface of the body 11. More specifically, the body 11 is cut in a manner of being punched in a radial direction of the body 11 with the three plastic-formed carbon plates 43a to 43c to thereby form the test liquid intake flow path 12. In this way, it is possible to obtain the electrode assembly 1 provided with the plural current electrodes 14 and the plural voltage electrodes 15 having the exposed surfaces coplanar with the inner wall surface of the test liquid intake flow path 12.

According to the conductivity meter 100 of the present embodiment configured as described above, since the first current electrode 141a and the second current electrode 141b on the side of the electronic substrate 131 are respectively opposed to the first current electrode 142a and the second current electrode 142b on the side of the electronic substrate 132 with the test liquid intake flow path 12 interposed therebetween, the electric flux lines outputted of the first current electrode 141a and the second current electrode 141b are easier to directly enter the first current electrode 142a and the second current electrode 142b without going around the body 11. Moreover, since the paired voltage electrodes 15a are arranged so as to be interposed between the first paired current electrodes 14a and the second paired current electrodes 14b, respectively, the density of the electric flux lines passing through between the paired voltage electrodes 15a is high. With these configurations, according to the electrode assembly 1 of the present embodiment, the electric flux lines leaking to the outside of the body 11 is reduced, and even in the case where the electrode assembly is brought close to a wall of a beaker containing a test liquid, for example, during a measurement, the density of the electric flux lines formed between the paired voltage electrodes 15a is not significantly varied and a measurement value of conductivity is not significantly varied. Therefore, it is possible to perform a measurement of conductivity with high accuracy regardless of a measurement location inside the beaker.

Further, each of the end faces of the current electrodes 141a and 141b (142a and 142b) included in the electrode assembly 1 is in a strip shapes do not surround the periphery of the voltage electrode 151a (152a), and furthermore, the current electrodes 141a and 141b (142a and 142b) and the voltage electrode 151a (152a) are provided so as to be adjacent to each other in such a manner that the longitudinal directions thereof are parallel to the axial direction of the body 11. Therefore, in the case where the thermosetting resin is poured into the tubular mold 41 and fixed in the manufacturing process, the thermosetting resin is allowed to easily flow into a space between the current electrodes 141a and 141b (142a and 142b) and the voltage electrode 151a (152a) and it is possible to easily fill this space with the resin.

Further, since each of the end faces of the current electrodes 141a and 141b (142a and 142b) is in a strip shapes, it is easy to process these electrodes, and the areas and the like of the current electrodes 141a and 141b (142a and 142b) can be easily varied according to a specification of a product.

OTHER EMBODIMENTS

It should be noted that the present invention is not limited to above embodiments.

In the electrode assembly 1 of the above embodiment, although the plural current electrodes 14 include two paired current electrodes 14a and 14b, the present invention is not limited to this, and in another embodiment, the plural current electrodes 14 may include only one paired current electrodes 14a, or it may include three or more paired current electrodes.

Figure 5:
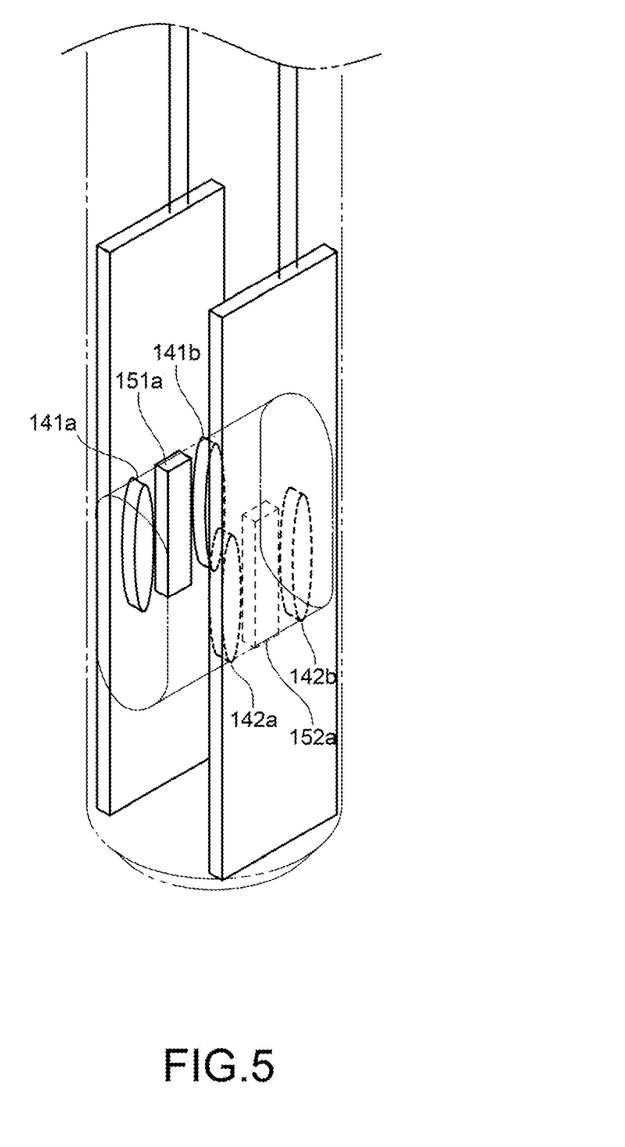
FIG. 5 is a schematic diagram showing a configuration of a current electrode and a voltage electrode of an electrode assembly of another embodiment.
Figure 6:
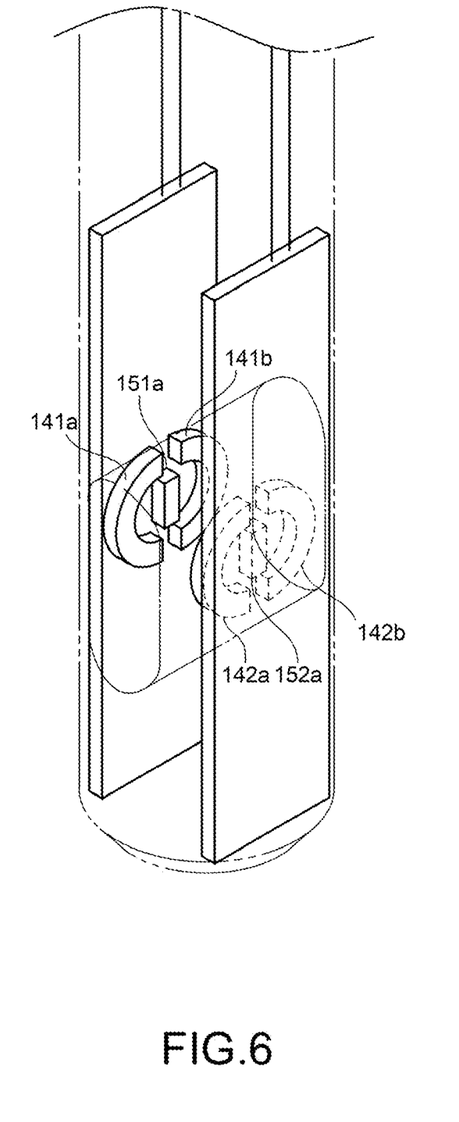
FIG. 6 is a schematic diagram showing a configuration of a current electrode and a voltage electrode of an electrode assembly of another embodiment.

In the electrode assembly 1 of the above embodiment, although each of the plural current electrodes 14 has the face exposed to the inner wall surface 121 or 122 which is a rectangular strip shape having corners at both ends, the present invention is not limited to this. In another embodiment, as shown in FIG. 5, the shape of the exposed face may be a strip shape having a rounded shape, elliptical shape or the like at both ends. In addition, the shape of the exposed face is not limited to a linear strip shape, but may be a U-character typed strip shape as shown in FIG. 6.

In the electrode assembly 1 of the above embodiment, although each of the plural current electrodes 14 and the plural voltage electrodes 15 is made of plastic-formed carbon, the present invention is not limited to this. It may be made of other carbon-based materials such as graphites, glassy carbon, and conductive diamond. Further, it may be made by forming a glassy carbon material or the other carbon-based material on a surface of a graphite material. Further, it may be made of a composite material combining a carbon-based material and the other materials. These materials may be appropriately selected according to an application and a specification of the electrode assembly 1.

Figure 7:
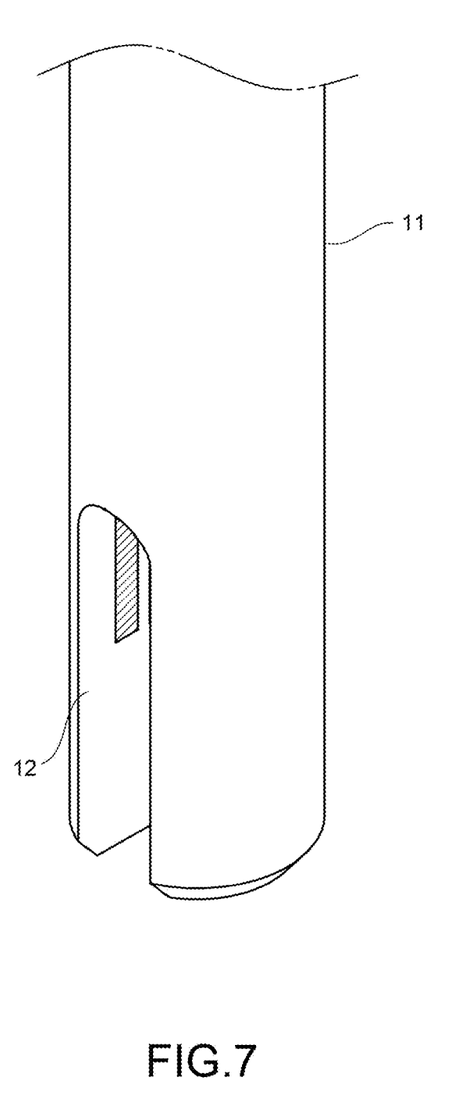
FIG. 7 is a schematic diagram showing a configuration of a test liquid intake flow path of an electrode assembly of another embodiment.

In the above embodiment, the test liquid intake flow path 12 is surrounded by the inner wall surface and the sectional shape in cross section parallel to the axial direction of the body 11 is an elongated hole shape, but the present invention is not limited to this. The test liquid intake flow path 12 of another embodiment may have an opening at a distal end in the axial direction of the body 11, for example, as shown in FIG. 7.

In addition, in the case where the test liquid intake flow path 12 is surrounded by the inner wall surface as in the above embodiment, a variation in a distance between the opposing inner wall surfaces 121 and 122 due to use for a long period of time can be suppressed and it is preferable that reduction in measurement accuracy can be effectively prevented.

In the above embodiment, although the electrode assembly 1 is connected to the conductivity meter main body 2 and is used for measuring the conductivity of the test liquid, the present invention is not limited to this. In another embodiment, the electrode assembly 1 may be connected to a resistivity meter main body for calculating resistivity and used for measuring resistivity of a test liquid. Further, the electrode assembly 1 may be connected to an electrical property meter capable of measuring both conductivity and resistivity and used for measuring both conductivity and resistivity of the test liquid.

In the conductivity meter 100 of the above embodiment, although the electrode assembly 1 and the conductivity meter main body 2 are separately provided, the present invention is not limited to this. In another embodiment, the conductivity meter main body 2 may be attached to the electrode assembly 1, and the electrode assembly 1 and the conductivity meter main body 2 may be integrally configured.

Further, in the above embodiment, although the display 21 is provided in the conductivity meter main body 2, the present invention is not limited to this, and the display 21 may be provided integrally with the electrode assembly 1. Moreover, the conductivity calculated by the conductivity meter main body 2 may be wirelessly or wiredly transmitted to an external device such as personal computers, tablets, smartphones, and other portable devices, and may be displayed on a display provided in the external device. Therefore, it is not always necessary to provide a display on the electrode assembly 1 or the conductivity meter main body 2.

Further, the function of the conductivity meter main body 2 may be provided in the external device. In this case, it may be configured such that, by installing a predetermined application in the external device, the output signal of the electrode assembly 1 may be received and the conductivity of the test liquid may be calculated based on the received output signal, and the calculated conductivity may be displayed on the display provided in the external device. This predetermined application may be provided to a user as a program, and this program may be provided in a state of being stored in a recording medium such as optical discs, and semiconductor memories, or may be provided by being downloaded via a network.

In addition, the present invention is not limited to the above embodiments, and it is needless to say that various modifications are possible without departing from the spirit thereof.

DESCRIPTION OF REFERENCE CHARACTERS

100: Conductivity meter
1: Electrode assembly
11: Body (electrode main body)
12: Test liquid intake flow path
121, 122: Inner wall surface
14a: First paired current electrodes (a pair of current electrodes)
14b: Second paired current electrodes (a pair of current electrodes)
15: A pair of voltage electrodes 2: Conductivity meter main body (conductivity calculator)

The invention claimed is:

1. An electrode assembly for a conductivity meter or resistivity meter comprising:
    an electrode main body;
    a test liquid intake flow path formed by a through hole passing through a side peripheral surface of the electrode main body;
    a pair of voltage electrodes which is respectively provided so that surfaces thereof are exposed to and substantially coplanar with opposing inner wall surfaces forming the test liquid intake flow path; and
    a pair of current electrodes which is respectively provided so that surfaces thereof are exposed to and substantially coplanar with each of the inner wall surfaces,
    wherein each of the pair of current electrodes contains a carbon-based material,
    wherein each of the surfaces of the pair of current electrodes exposed to the inner wall surfaces is in a strip shape having a longitudinal direction substantially parallel to an axial direction of the electrode main body, and
    wherein a space between the current electrodes and the voltage electrodes is filled with resin.

2. The electrode assembly for the conductivity meter or the resistivity meter according to claim 1, comprising plural pairs of the current electrodes, wherein the pair of voltage electrodes is positioned between the plural pairs of the current electrodes.

3. The electrode assembly for the conductivity meter or the resistivity meter according to claim 1, wherein the electrode main body is formed to have a column shape, the pair of voltage electrodes and the pair of current electrodes are provided so as to be parallel to an axis direction of the electrode main body, and the pair of voltage electrodes and the pair of current electrodes are provided so as to be adjacent to each other along a passing-through direction of the test liquid intake flow path.

4. The electrode assembly for the conductivity meter or the resistivity meter according to claim 1, wherein a glassy carbon material is used as the carbon-based material.

5. A conductivity meter comprising:
    the electrode assembly according to claim 1; and
    a conductivity calculator that receives an output signal of the electrode assembly and calculates the conductivity based on the received output signal and outputs the calculated conductivity.

6. A resistivity meter comprising:
    the electrode assembly according to claim 1; and
    a resistivity calculator that receives an output signal of the electrode assembly and calculates the resistivity based on the received output signal and outputs the calculated resistivity.

7. An electrode assembly for a conductivity meter or resistivity meter comprising:
    an electrode main body;
    a test liquid intake flow path formed by a through hole passing through a side peripheral surface of the electrode main body;
    a pair of voltage electrodes which is respectively provided so that surfaces thereof are exposed to and substantially coplanar with opposing inner wall surfaces forming the test liquid intake flow path; and
    a pair of current electrodes which is respectively provided so that surfaces thereof are exposed to and substantially coplanar with each of the inner wall surfaces, each of the surfaces of the current electrodes having a longitudinal direction substantially parallel to an axial direction of the electrode main body,
    wherein each of the pair of current electrodes contains a carbon-based material, and
    wherein each of the current electrodes and each of the voltage electrodes are respectively surrounded by a resin member in each of the inner wall surfaces, and
    wherein the resin member surrounding the current electrodes and the resin member surrounding the voltage electrodes are continuous in each of the inner wall surfaces and fill a space between the current electrodes and the voltage electrodes.

* * * * *